United States Patent [19]
Yamamoto

[11] Patent Number: 5,406,230
[45] Date of Patent: Apr. 11, 1995

[54] CHIP TYPE OSCILLATOR AND OSCILLATION CIRCUIT USING THIS OSCILLATOR

[75] Inventor: Takashi Yamamoto, Nagaokakyo, Japan

[73] Assignee: Murata Manufacturing Co., Ltd., Kyoto, Japan

[21] Appl. No.: 22,712

[22] Filed: Feb. 24, 1993

[30] Foreign Application Priority Data

| Feb. 25, 1992 | [JP] | Japan | 4-075181 |
| Mar. 13, 1992 | [JP] | Japan | 4-089595 |
| Nov. 6, 1992 | [JP] | Japan | 4-322819 |

[51] Int. Cl.$^6$ ............... H01L 41/04; H03B 5/32
[52] U.S. Cl. ............... 331/46; 331/158; 331/162; 310/349; 310/366
[58] Field of Search ............... 331/162, 158, 46, 56; 310/349, 366, 365

[56] References Cited

U.S. PATENT DOCUMENTS

| 4,039,969 | 8/1977 | Martin | 310/366 |
| 4,464,599 | 8/1984 | Briese | 310/365 |
| 4,558,248 | 12/1985 | Valentin | 310/349 |
| 4,652,784 | 3/1987 | Inoue et al. | 310/366 |

FOREIGN PATENT DOCUMENTS

| 59-157327 | 10/1984 | Japan. |
| 61-136630 | 8/1986 | Japan. |
| 62-34820 | 2/1987 | Japan. |
| 62-146319 | 9/1987 | Japan. |
| 62-169535 | 10/1987 | Japan. |

Primary Examiner—Andrew M. Dolinar
Attorney, Agent, or Firm—Ostrolenk, Faber, Gerb & Soffen

[57] ABSTRACT

A chip type oscillator which comprises two oscillator elements bonded to each other, and two protective plates bonded to the outer surfaces of the oscillator elements. The oscillator elements have lead electrodes which are provided on corner portions thereof and are connected with vibrating electrodes, and the protective plates have external electrodes which are provided on corner portions thereof. The external electrodes and the lead electrodes are independently connected with each other through conductive coatings provided on peripheral surfaces of the oscillator chip. Integrated load capacitors may also be formed on the oscillator chip. The two oscillator elements are so integrated with each other that it is possible to reduce the number of components as well as the packaging area and simplify the mounting operation.

19 Claims, 5 Drawing Sheets

CHIP TYPE OSCILLATOR AND OSCILLATION CIRCUIT USING THIS OSCILLATOR

BACKGROUND OF THE INVENTION

The present invention relates to a chip type oscillator which is preferably applied to a source which generates a reference clock signal for a microprocessor or microcomputer, for example, and an oscillation circuit using this oscillator.

Microprocessors have been generally employed in the past as elements having a single function. In recent years, however, various functions in an apparatus such as a VTR or an air conditioner have increasingly employed microprocessors. Thus, a one chip microcomputer capable of performing a plurality of functions is awaited. To perform signal processing, a microcomputer necessarily requires a reference clock signal, which is usually generated by a crystal oscillator or a ceramic oscillator. The frequency of this clock signal substantially depends on a signal to be processed. Thus, a plurality of types of clock signals are required as the number of functions of a microcomputer is increased.

Figure 1:
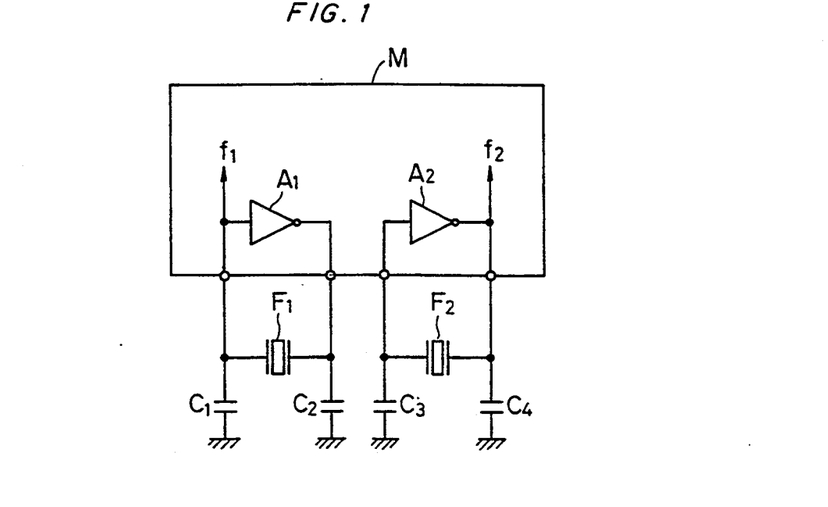
FIG. 1 is a circuit diagram showing conventional Colpitts oscillation circuits which are connected to a microcomputer.

FIG. 1 shows a structure including two Colpitts oscillation circuits, which are formed by connecting two ceramic oscillators $F_1$ and $F_2$ having different frequency characteristics and four load capacitors $C_1$ to $C_4$ to a microcomputer M for obtaining two types of clock signals $f_1$ and $f_2$. Symbols $A_1$ and $A_2$ denote amplifiers which are contained in the microcomputer M for forming the Colpitts type oscillation circuits.

The aforementioned oscillator $F_1$ or $F_2$ may be prepared from a chip type oscillator which is disclosed in Japanese Utility Model Laying-Open Gazette No. 61-136630 (1986), for example. This oscillator is prepared by forming a vibrating electrode and a lead electrode on both front and back surfaces of a piezoelectric ceramic substrate respectively and bonding protective plates onto the front and back surfaces of the substrate for defining vibration cavities between the substrate and the plates. External electrodes are provided on both sides of the protective plates to connect with the lead electrodes.

In order to apply such an oscillator as a generation source of a reference clock signal for a microcomputer, however, it is necessary to use a plurality of oscillators having different frequency characteristics for respective clock signals. For example, two oscillators and four load capacitors are required for generating two clock signals as shown in FIG. 1, and soldering is required in 12 portions in total. In this case, the number of such components is increased although the microcomputer is formed on one chip, and the circuit area is increased when these components are mounted on a printed board.

SUMMARY OF THE INVENTION

Accordingly, an object of the present invention is to provide a chip type oscillator which can be formed by bonding a plurality of oscillator elements, thereby reducing the number of components as well as the circuit area.

Another object of the present invention is to provide a chip type oscillator which is suitably applied in an oscillation circuit for generating a plurality of reference clock signals.

Still another object of the present invention is to provide a miniaturized oscillation circuit having a simple structure.

The chip type oscillator according to the present invention comprises two oscillator elements which are laminated and bonded to each other, and two protective plates which are bonded to the outer surfaces of the oscillator elements. Each of the oscillator elements has vibrating electrodes which are provided on opposite central portions of front and back surfaces of a piezoelectric ceramic substrate and two lead electrodes provided on different outer edge portions of the front and back surfaces of the substrate to be connected with the vibrating electrodes. Directions of the oscillator elements are set so that the lead electrodes are not cross-directionally opposed to each other. The first vibration cavity is defined between the oscillator elements in portions corresponding to the vibrating electrodes, while the second and the third vibration cavities are defined between the protective plates and the oscillator elements in portions corresponding to the vibration electrodes. At least one of the protective plates is provided on its outer edge portion with four independent external electrodes, which are connected with the lead electrodes respectively through conductive coatings provided on peripheral surfaces.

When this oscillator is applied as a single oscillation source of a microcomputer requiring two clock signals, there is no need for another oscillator, so that the circuit area can be reduced and the packaging density can be improved.

When the oscillator has a square shape, the lead electrodes and the external electrodes are preferably provided on four corner portions of the oscillator. In this case, distances between the external electrodes can be secured so as to facilitate being mounted on a printed circuit board, and conduction areas of the lead electrodes and conductive coatings are widened. As for the arrangement of the lead electrodes, the lead electrodes of one oscillator element may be provided on diagonal corner portions so that those of the other oscillator element are provided on different diagonal corners, or the lead electrodes of one oscillator element may be provided on both end corner portions of one edge so that those of the other oscillator element are provided on both end corner portions of an edge opposite thereto.

At least one of the protective plates may be formed by a dielectric plate and a capacitor electrode may be provided on the outer surface of this plate crossing between the external electrodes. In this case, since a plurality of capacitors are formed between the capacitor electrodes and the external electrodes, it is possible to integrally contain plural oscillator elements and capacitors. Thus, principal parts of a plurality of Colpitts oscillation circuits can be formed by a single oscillator with no need for load capacitors serving as discrete elements, whereby the circuit becomes more simplified.

The oscillator is preferably in the form of a rectangle having different vertical and transverse dimensions. In this case, it is possible to recognize directions from the shape when the oscillator is mounted on a printed board, to decrease connection errors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
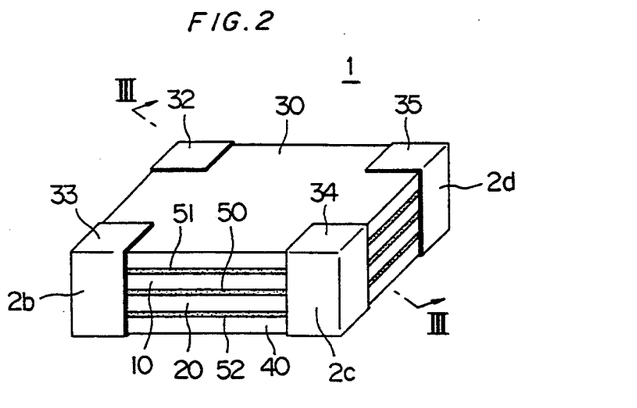
FIG. 2 is a perspective view showing a chip type oscillator according to a first embodiment of the present invention.
Figure 3:
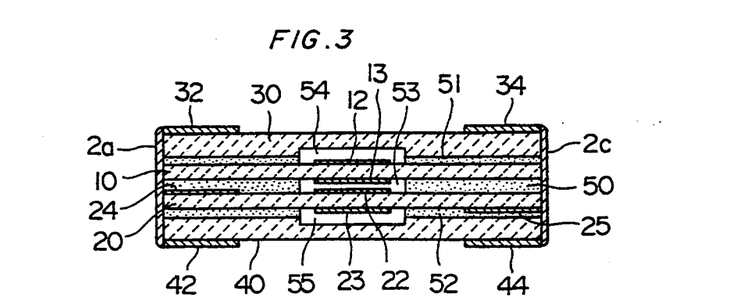
FIG. 3 is a cross sectional view taken along the line III—III in FIG. 2.
Figure 4:
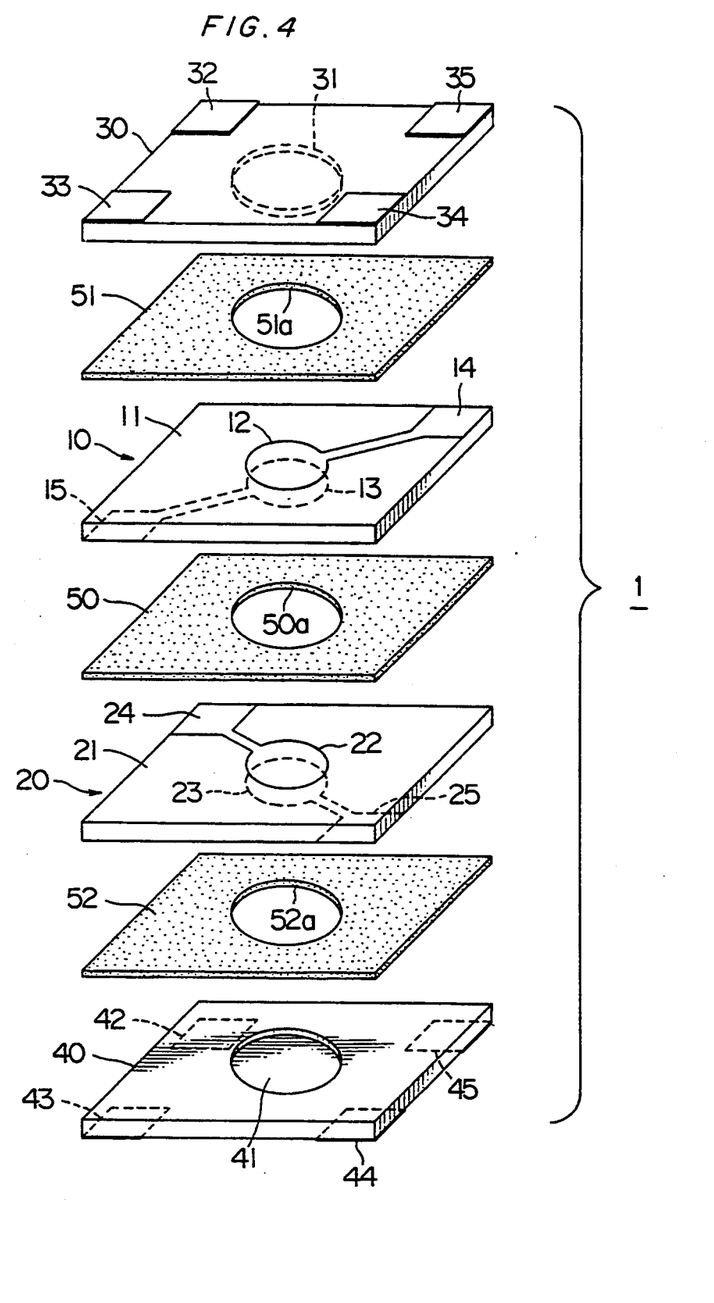
FIG. 4 is a disassembled perspective view of the oscillator shown in FIG. 2.

FIGS. 2, 3 and 4 illustrate a chip type ceramic oscillator according to a first embodiment of the present invention.

This ceramic oscillator 1 is formed by laminating and bonding two oscillator elements 10 and 20 and two protective plates 30 and 40 by adhesive layers 50, 51 and 52. This oscillator 1 is in the form of a rectangle having different vertical and transverse dimensions.

The oscillation elements 10 and 20, both of which employ energy trapping thickness expansion vibration modes, comprise piezoelectric ceramic substrates 11 and 21 having vibrating electrodes 12, 13, 22 and 23 provided on opposite central portions of front and back surfaces thereof respectively. The vibrating electrodes 12 and 13 of the element 10 are connected with lead electrodes 14 and 15 which are provided on diagonal corners of the substrate 11 along one diagonal direction, while the vibrating electrodes 22 and 23 of the other element 20 are connected with lead electrodes 24 and 25 which are provided on diagonal corners of the substrate 21 along another diagonal direction. Resonance frequencies of the elements 10 and 20 are varied by changing the thicknesses of the substrates 11 and 21 or the dimensions of the vibrating electrodes 12, 13, 22 and 23, or providing means for carrying out vibration damping or the like.

The adhesive layer 50 sandwiched between the elements 10 and 20 is provided in its central portion with an opening 50a corresponding to the vibrating electrodes 13 and 22. When the elements 10 and 20 are bonded by the layer 50, the first vibration cavity 53 is defined by the surfaces of the vibrating electrodes 13 and 22. Thus, vibration of the elements 10 and 20 will not be damped unnecessarily.

The protective plates 30 and 40, which are formed by insulating plates of resin or ceramics, are provided in inner side surfaces thereof with hollows 31 and 41 which are slightly larger than the vibrating electrodes 12 and 23. The adhesive layers 51 and 52 sandwiched between the plates 30 and 40 and the elements 10 and 20 respectively are provided in central portions thereof with openings 51a and 52a of the same shapes as the hollows 31 and 41. As a result, the second and the third vibration cavities 54 and 55 are defined on the surfaces of the vibrating electrodes 12 and 23 when the plates 30 and 40 are bonded to the outer surfaces of the elements 10 and 20. The plates 30 and 40 are provided on four corner portions thereof with independent external electrodes 32 to 35 and 42 to 45 respectively. After the elements 10 and 20 and the plates 30 and 40 are bonded, conductive coatings 2a to 2d (2a and 2c are shown in FIG. 3) are formed on peripheral surfaces of the thus obtained laminate. Thus the coating 2a connects the electrodes 32, 24 and 42, the coating 2b connects the electrodes 33, 15 and 43, the coating 2c connects the electrodes 34, 25 and 44, and the coating 2d connects the electrodes 35, 14 and 45.

The electrodes 12 to 15, 22 to 25, 32 to 35 and 42 to 45 and the conductive coatings 2a to 2d are formed by a well-known method such as sputtering, vapor deposition, printing and baking of conductive paste, or the like. Particularly when peripheral surfaces of the laminate are subjected to sand blasting or the like before formation of the conductive coatings 2a to 2d, the peripheral edges of the lead electrodes 14, 15, 24 and 25 are effectively exposed and the connections between the conductive coatings 2a to 2d and the lead electrodes are improved.

Although FIG. 4 illustrates the adhesive layers 50, 51 and 52 as separate sheets from the elements 10 and 20 and the plates 30 and 40, a adhesive paste may alternatively be applied to the surfaces of the elements 10 and 20 or the inner side surfaces of the plates 30 and 40 by a method such as printing. While such adhesive layers are generally prepared from an epoxy adhesive, another type of material may alternatively be employed.

Figure 5:
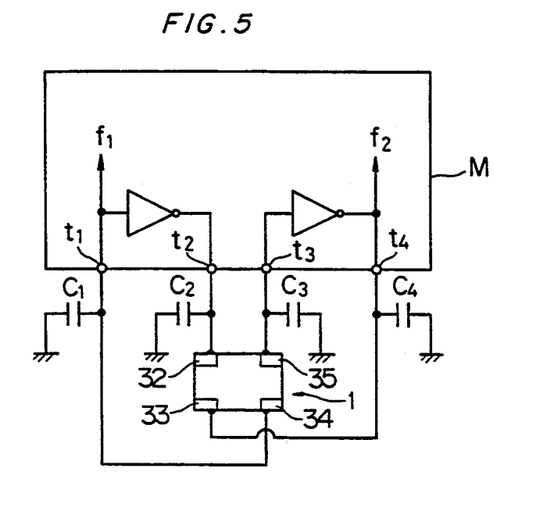
FIG. 5 is a circuit diagram showing the oscillator of FIG. 2 connected to a microcomputer.

FIG. 5 shows an oscillator 1, which is obtained by laminating and bonding in the aforementioned manner and is connected to a one-chip microcomputer M. In this case, the external electrodes 34 and 32 provided on diagonal corners of the oscillator are connected to two terminals $t_1$ and $t_2$ of the microcomputer M for forming a Colpitts oscillation circuit, while external electrodes 33 and 35 provided on the other diagonal corners positions are connected to other two terminals $t_3$ and $t_4$ for forming another Colpitts oscillation circuit. External load capacitors $C_1$ to $C_4$ are connected to the terminals $t_1$ to $t_4$ respectively.

In this case, only a single oscillator is required unlike the conventional oscillation circuit (see FIG. 1) employing two oscillators, whereby the circuit area is reduced and the packaging density can be improved.

Figure 6:
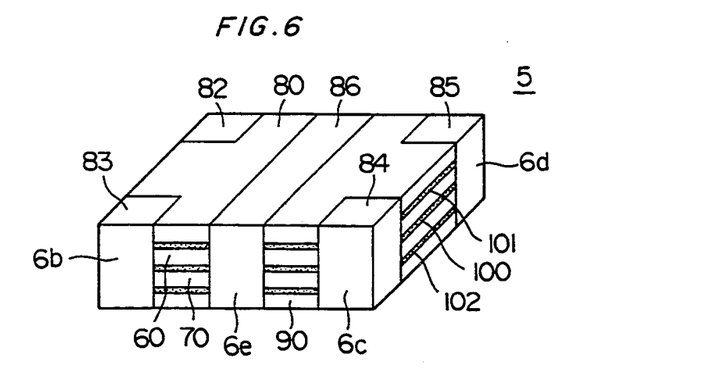
FIG. 6 is a perspective view showing an oscillator containing a capacitor according to a second embodiment of the present invention.
Figure 7:
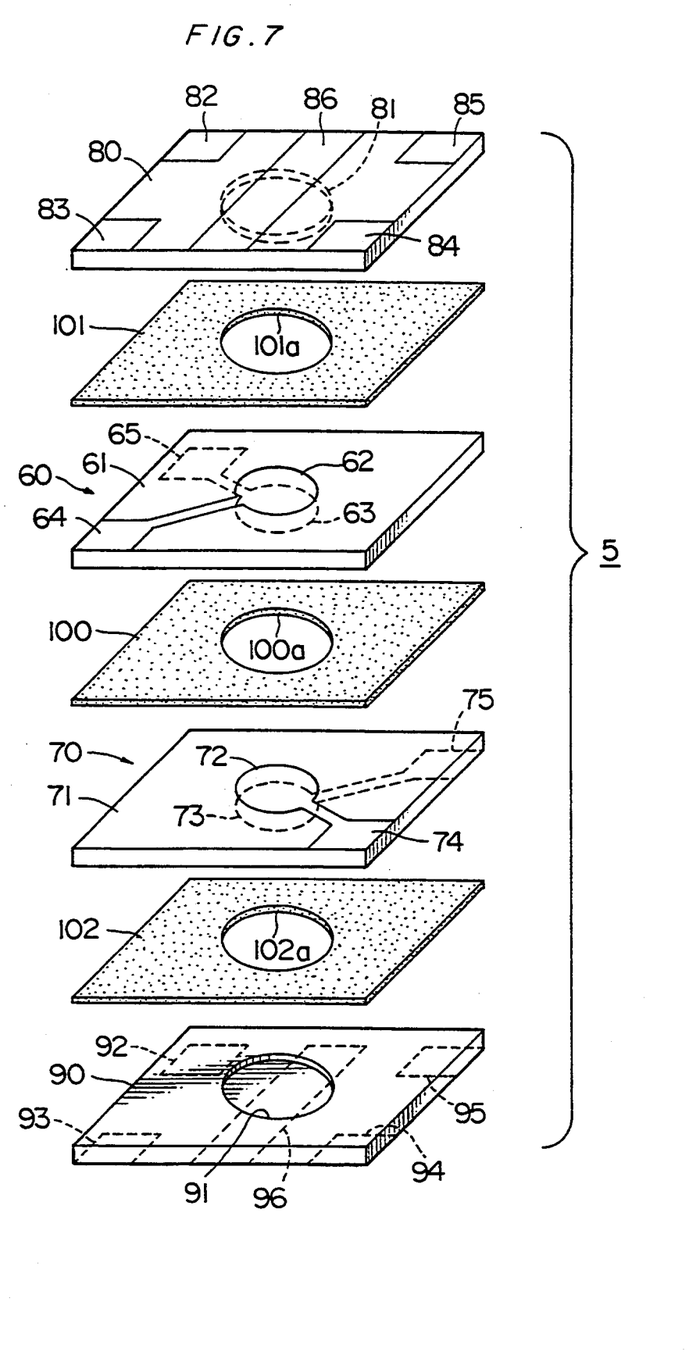
FIG. 7 is a disassembled perspective view of the oscillator shown in FIG. 6.

FIGS. 6 and 7 illustrate a chip type ceramic oscillator according to a second embodiment of the present invention.

This ceramic oscillator 5 is formed by laminating and bonding two oscillator elements 60 and 70 and two protective plates 80 and 90 with each other by means of adhesive layers 100, 101 and 102, to have a rectangular shape.

The elements 60 and 70, employing energy trapping thickness expansion vibration modes, comprise piezoelectric ceramic substrates 61 and 71 and vibrating electrodes 62, 63, 72 and 73 formed on opposite central portions of front and back surfaces thereof. The vibrating electrodes 62 and 63 of the element 60 are connected with lead electrodes 64 and 65 which are provided on both corner portions along a shorter edge, while the vibrating electrodes 72 and 73 of the other element 70 are connected with lead electrodes 74 and 75 which are provided on both corner portions of a shorter edge which is opposite to that provided with the lead electrodes 64 and 65. Resonance frequencies of the elements 60 and 70 are varied by changing the thicknesses of the piezoelectric ceramic substrates 61 and 71 or the dimensions of the vibrating electrodes 62, 63, 72 and 73, or a method such as vibration damping.

The protective plates 80 and 90, being made of dielectric ceramics, are provided in inner side surfaces thereof with hollows 81 and 91 which are slightly larger than the vibrating electrodes 62 and 73. External electrodes 82 to 85 and 92 to 95 are previously formed on four corner portions of the plates 80 and 90, and strip-shaped capacitor electrodes 86 and 96 are formed on central portions of outer side surfaces of the plates 80 and 90 along the shorter edge direction. After the elements 60 and 70 are bonded and laminated with the plates 80 and 90, conductive coatings 6a to 6d (6a is not shown in the figure) are formed on peripheral surfaces of the laminate thus obtained, for connecting the external electrodes 82 to 85 and 92 to 95 with the lead electrodes 64, 65, 74 and 75 respectively. Also a conductive coating 6e is formed on the peripheral surface of the laminate for connecting the capacitor electrodes 86 and 96 with each other.

The adhesive layer 100 sandwiched between the elements 60 and 70 is provided in its central portion with an opening 100a for defining vibration cavities. The adhesive layers 101 and 102 sandwiched between the plates 80 and 90 and the elements 60 and 70 are also provided in central portions thereof with openings 101a and 102a having the same shapes as the hollows 61 and 71.

Figure 8:
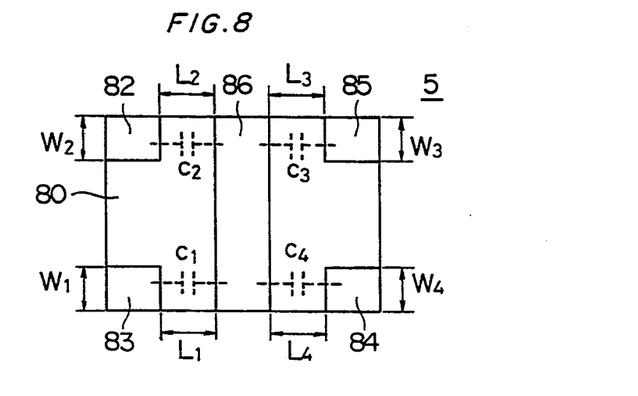
FIG. 8 is a plan view showing formation of a load capacitor contained in the oscillator shown in FIG. 6.

In this oscillator, as shown in FIG. 8, it is possible to attain desired capacitors $c_1$ to $c_4$ by selecting distances $L_1$ to $L_4$ between the capacitor electrodes 86 and the external electrodes 82 to 85 and widths $W_1$ to $W_4$ of the external electrodes 82 to 85. Although the electrodes 96 and 92 to 95 are not shown in this FIG. 8, these are arranged in the same manner as the aforementioned electrodes 86 and 82 to 85.

Figure 9:
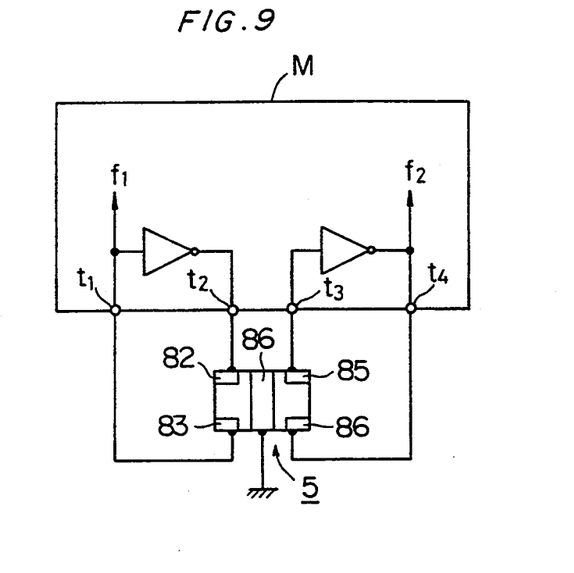
FIG. 9 is a circuit diagram showing the oscillator of FIG. 6 connected to a microcomputer.

FIG. 9 shows the aforementioned oscillator 5, which is connected to a one-chip microcomputer M. In this case, the two external electrodes 83 and 82 provided on one shorter edge side are connected to terminals $t_1$ and $t_2$ of the microcomputer M' and the external electrodes 85 and 84 provided on the opposite shorter edge side are connected to terminals $t_3$ and $t_4$, while the capacitor electrode 86 is grounded. Since the oscillator 5 contains four integral capacitors $c_1$ to $c_4$, there is no need for external capacitors. As a result, only a single oscillator is sufficient as an external component for forming two Colpitts oscillation circuits. Thus, the circuit area can be reduced with a small number of soldering portions, whereby reliability is improved.

Although both plates 80 and 90 are provided with the capacitor electrodes 86 and 96 in the second embodiment, only one of such plates may optionally be provided with a capacitor electrode. In this case, it is not necessary to form the plates of the same materials, but rather, the one without a capacitor electrode may be made of strong ceramics or resin. Further, the direction of the capacitor electrode is not restricted to being along the shorter edge direction, but rather, the capacitor electrode may be provided along the longer edge direction. In this case, it is necessary to provide the lead electrodes of each oscillator element on both corner portions of a longer edge.

The present invention is not restricted to the aforementioned embodiments, but can be modified and corrected by those skilled in the art within the scope of the invention.

Figure 10:
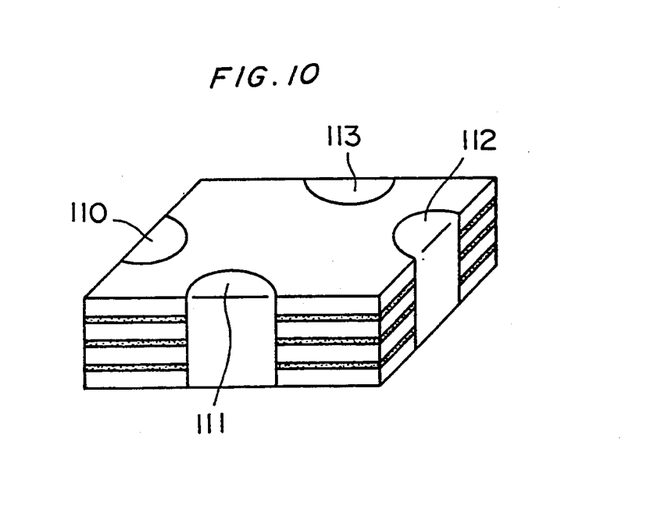
FIG. 10 is a perspective view showing a chip type oscillator according to a third embodiment of the present invention.

For example, the positions of the lead electrodes and the external electrodes are not restricted to being at the corner portions of the oscillator elements and the protective plates, but rather such electrodes may alternatively be provided on intermediate portions of respective edges, as shown in FIG. 10. In this case, external electrodes 110 to 113 may be in the form of circular arcs.

Although the protective plates are provided in inner side surfaces thereof with hollows for defining vibration cavities in the aforementioned embodiments, such hollows may be omitted so that the vibration cavities may be defined by the openings of the adhesive layers.

The shape of the oscillator is not restricted to rectangular but it may have a square, polygonal or circular shape. When the oscillator has a rotation-symmetrical shape, it is possible to recognize directions by marking appropriately.

The oscillator elements employed in the present invention may not be different from but rather may be identical to each other in resonance frequency. Further, the oscillator elements may have different temperature characteristics although they may have the same frequencies at room temperature.

The capacitor electrodes can be provided not only in the oscillator according to the second embodiment but also in the oscillator according to the first embodiment. It is to be noted that the second embodiment is simpler in interconnection than the first embodiment since circuits connecting oscillator with the microcomputer do not intersect with each other.

The external electrodes may be provided on only one of the protective plates. However, the external electrodes are preferably provided on both protective plates, so that the oscillator can be connected to a printed board in an inverted state with no problem.

The oscillator may vibrate not only in the thickness expansion mode but also in any other vibration mode such as a thickness shear-slide mode, which is appropriately selected in response to a required oscillation frequency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Chip type oscillator comprising two oscillator elements bonded to each other and two protective plates bonded to outer surfaces of said oscillator elements, wherein each of said oscillator elements has a piezoelectric ceramic substrate, vibrating electrodes formed on opposite central portions of front and back surfaces of said substrate which are opposed to each other in a thickness direction of said chip-type oscillator, and two lead electrodes connected respectively with said vibrating electrodes are formed on different outer edge portions on said front and back surfaces of said substrate, said four lead electrodes being arranged on said substrates so that no two lead electrodes are opposed to each other in said thickness direction of said chip-type oscillator, a first vibration cavity is defined between said oscillator elements at a location corresponding to said vibrating electrodes, second and third vibrating cavities are defined between said protective plates and said oscillator elements at locations corresponding to said vibrating electrodes, and four external electrodes are independently formed on outer edge portions of at least one of said protective plates, said four external electrodes being connected with said four lead electrodes through respective conductive coatings provided on peripheral surfaces of said chip-type oscillator.

2. Chip oscillator in accordance with claim 1, wherein said oscillator elements and said protective plates have substantially identical substantially rectangular shapes, said lead electrodes of one of said oscillator elements are provided on two opposite diagonal corner portions thereof and said lead electrodes of the other one of said oscillator elements are provided on the other two opposite diagonal corner portions, and said external electrodes are provided on four corner portions of said protective plates and are connected with said lead electrodes respectively.

3. Chip type oscillator in accordance with claim 1, wherein said oscillator elements and said protective plates have substantially identical substantially rectangular shapes, said lead electrodes of one of said oscillator elements are provided on both adjacent corner portions along one edge thereof and said lead electrodes of the other one of said oscillator elements are provided on both adjacent corner portions of an edge opposite to said one edge, and said external electrodes are provided on four corner portions of said protective plates and are connected with said lead electrodes respectively.

4. Chip type oscillator in accordance with claim 1, wherein at least one of said protective plates is a dielectric plate, and said dielectric plate is provided on its outer surface with a capacitor electrode, thereby forming capacitors between said capacitor electrode and said external electrodes.

5. Chip type oscillator in accordance with claim 2, wherein at least one of said protective plates is a dielectric plate, and said dielectric plate is provided on its outer surface with a capacitor electrode, thereby forming capacitors between said capacitor electrode and said external electrodes.

6. Chip type oscillator in accordance with claim 3, wherein at least one of said protective plates is a dielectric plate, and said dielectric plate is provided on its outer surface with a capacitor electrode, thereby forming capacitors between said capacitor electrode and said external electrodes.

7. Chip type oscillator in accordance with claim 2, wherein said oscillator elements and said protective plates have substantially identical substantially square shapes.

8. Chip type oscillator in accordance with claim 3, wherein said oscillator elements and said protective plates have substantially identical substantially square shapes.

9. Chip type oscillator in accordance with claim 1, wherein said oscillator elements have different resonance frequencies respectively.

10. Chip type oscillator in accordance with claim 2, wherein said oscillator elements have different resonance frequencies respectively.

11. Chip type oscillator in accordance with claim 3, wherein said oscillator elements have different resonance frequencies respectively.

12. Oscillation circuit employing a chip type oscillator, wherein said chip type oscillator comprises two oscillator elements bonded to each other, having different respective resonance frequencies, and two protective plates bonded to outer surfaces of said oscillator elements, each of said oscillator elements has a piezoelectric ceramic substrate, vibrating electrodes formed on opposite central portions of front and back surfaces of said substrate which are opposed to each other in a thickness direction of said chip-type oscillator, and two lead electrodes connected respectively with said vibrating electrodes are formed on different outer edge portions on said front and back surfaces of said substrate, said four lead electrodes being arranged on said substrates so that no two lead electrodes are opposed to each other in said thickness direction of said chip-type oscillator, a first vibration cavity is defined between said oscillator elements in at a location corresponding to said vibrating electrodes, second and third vibrating cavities are defined between said protective plates and said oscillator elements at locations corresponding to said vibrating electrodes, and four external electrodes are independently formed on outer edge portions of at least one of said protective plates, said four external electrodes being connected with said four lead electrodes through respective conductive coatings provided on peripheral surfaces of said chip-type oscillator, and further comprising a microcomputer comprising first and second circuit means for forming respective Colpitts oscillation circuits, a first pair of said external electrodes connected with said lead electrodes of one of said oscillator elements are connected to said first circuit means in said microcomputer for forming a first Colpitts oscillation circuit, and a second pair of said external electrodes connected with said lead electrodes of the other one of said oscillator elements are connected to said second circuit means in said microcomputer for forming a second Colpitts oscillation circuit, each said oscillation circuit generating a different respective frequency signal.

13. An oscillation circuit in accordance with claim 12, wherein said oscillator elements and said protective plates have substantially identical substantially rectangular shapes, said lead electrodes of one of said oscillator elements are provided on two opposite diagonal corner portions thereof and said lead electrodes of the other one of said oscillator elements are provided on the other two opposite diagonal corner portions, and said external electrodes are provided on four corner portions of said protective plates and are connected with said lead electrodes respectively.

14. An oscillation circuit in accordance with claim 12, wherein said oscillator elements and said protective plates have substantially identical substantially rectangular shapes, said lead electrodes of one of said oscillator elements are provided on both adjacent corner portions along one edge thereof and said lead electrodes of the other one of said oscillator elements are provided on both adjacent corner portions of an edge opposite to said one edge, and said external electrodes are provided on four corner portions of said protective plates and are connected with said lead electrodes respectively.

15. An oscillation circuit in accordance with claim 12, wherein at least one of said protective plates is a dielectric plate, said dielectric plate is provided on its outer surface with a capacitor electrode, thereby forming capacitors between said capacitor electrode and said external electrodes, and said capacitor electrode is grounded.

16. Chip type oscillator comprising two oscillator elements bonded to each other and two protective plates bonded to outer surfaces of said oscillator elements, Wherein each of said two oscillator elements has a respective piezoelectric ceramic substrate, vibrating electrodes formed respectively on front and back surfaces of said substrate which are opposed to each other in a thickness direction of said chip-type oscillator, and two lead electrodes connected respectively with said vibrating electrodes formed on outer edge portions of said substrate, vibration cavities being defined at locations adjacent said vibrating electrodes within said oscillator, and four external electrodes are formed on respective outer edge portions of at least one of said protective plates, wherein said four lead electrodes are arranged on said substrates so that no two lead electrodes are opposed to each other in said thickness direction of said chip-type oscillator.

17. Oscillator as claimed in claim 16, wherein said four external electrodes are connected with said four lead electrodes through respective conductive coatings provided on peripheral surfaces of said chip-type oscillator.

18. Chip type oscillator comprising two oscillator elements bonded to each other and two protective plates bonded to outer surfaces of said oscillator elements, wherein each of said two oscillator elements has a respective piezoelectric ceramic substrate, vibrating electrodes formed respectively on front and back surfaces of said substrate which are opposed to each other in a thickness direction of said chip-type oscillator, and two lead electrodes connected respectively with said vibrating electrodes formed on outer edge portions of said substrate, vibration cavities being defined at locations adjacent said vibrating electrodes within said oscillator, and four external electrodes are formed on respective outer edge portions of at least one of said protective plates, wherein at least one of said protective plates is a dielectric plate, and said dielectric plate is provided with a capacitor electrode which is operative for forming a capacitor between said capacitor electrode and at least one of said external electrodes.

19. Oscillator as claimed in claim 18, wherein said four external electrodes are connected with said four lead electrodes through respective conductive coatings provided on peripheral surfaces of said chip-type oscillator.

* * * * *